United States Patent
Yoo et al.

(10) Patent No.: US 6,544,845 B2
(45) Date of Patent: Apr. 8, 2003

(54) METHODS OF FABRICATING NONVOLATILE MEMORY DEVICES INCLUDING BIRD'S BEAK OXIDE

(75) Inventors: Jong-weon Yoo, Kyungki-do (KR); Myoung-kwan Cho, Kyungki-do (KR); Jin-woo Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/854,790

(22) Filed: May 14, 2001

(65) Prior Publication Data

US 2001/0025981 A1 Oct. 4, 2001

Related U.S. Application Data

(62) Division of application No. 09/026,539, filed on Feb. 19, 1998.

(30) Foreign Application Priority Data

Mar. 5, 1997 (KR) .............................................. 97-7258

(51) Int. Cl.[7] .............................................. H01L 21/336
(52) U.S. Cl. ........................................ 438/257; 438/264
(58) Field of Search .................................. 438/257, 264

(56) References Cited

U.S. PATENT DOCUMENTS

| | | | | |
|---|---|---|---|---|
| 4,635,347 A | * | 1/1987 | Lien et al. | 148/DIG. 147 |
| 4,775,642 A | * | 10/1988 | Chang et al. | 257/315 |
| 4,997,781 A | | 3/1991 | Tigelaar | 437/43 |
| 5,082,794 A | * | 1/1992 | Pfiester et al. | 148/DIG. 122 |
| 5,208,175 A | | 5/1993 | Choi et al. | 437/43 |
| 5,449,634 A | * | 9/1995 | Inoue | 438/258 |

FOREIGN PATENT DOCUMENTS

| | | |
|---|---|---|
| JP | 4-116869 | 4/1992 |
| JP | 6-132489 | 5/1994 |
| JP | 6-163916 | 6/1994 |

OTHER PUBLICATIONS

Prall et al., *Characterization and Suppression of Drain Coupling in Submicrometer EPROM Cells*, IEEE Transactions on Electron Devices, vol. ED–34, No. 12, Dec. 1987, pp. 2463–2468.

PTO 99–0384, USPTO Translation of JP–06–132489, Nov. 1998.

\* cited by examiner

*Primary Examiner*—Wael Fahmy
*Assistant Examiner*—Howard Weiss
(74) *Attorney, Agent, or Firm*—Myers Bigel Sibley & Sajovec

(57) ABSTRACT

A nonvolatile memory device which suppress a drain coupling by minimizing an overlap capacitance between a floating gate and a drain. The nonvolatile memory device includes a cell array region in which a plurality of memory cells are two-dimensionally arranged and a peripheral circuit region for driving the memory cells. The memory cells comprise a first conductivity type semiconductor substrate, second conductivity type source and drain regions separated from each other with a channel region therebetween on the main surface of the semiconductor substrate, a gate oxide film formed on the upper portion of the channel region, a floating gate formed on the gate oxide film, an interlayer dielectric film formed on the upper portion of the floating gate, a control gate formed on the interlayer dielectric film, and a bird's beak area formed between the source/drain regions and the floating gate having greater thickness than the gate oxide film.

20 Claims, 7 Drawing Sheets

(a)

(b)

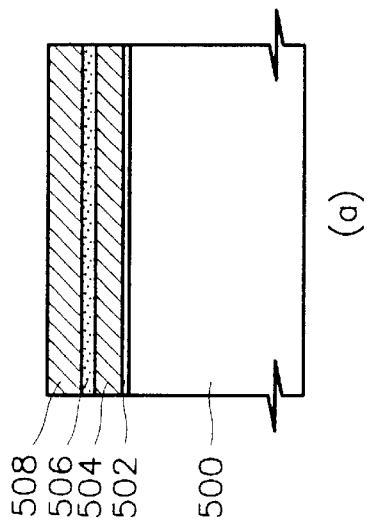
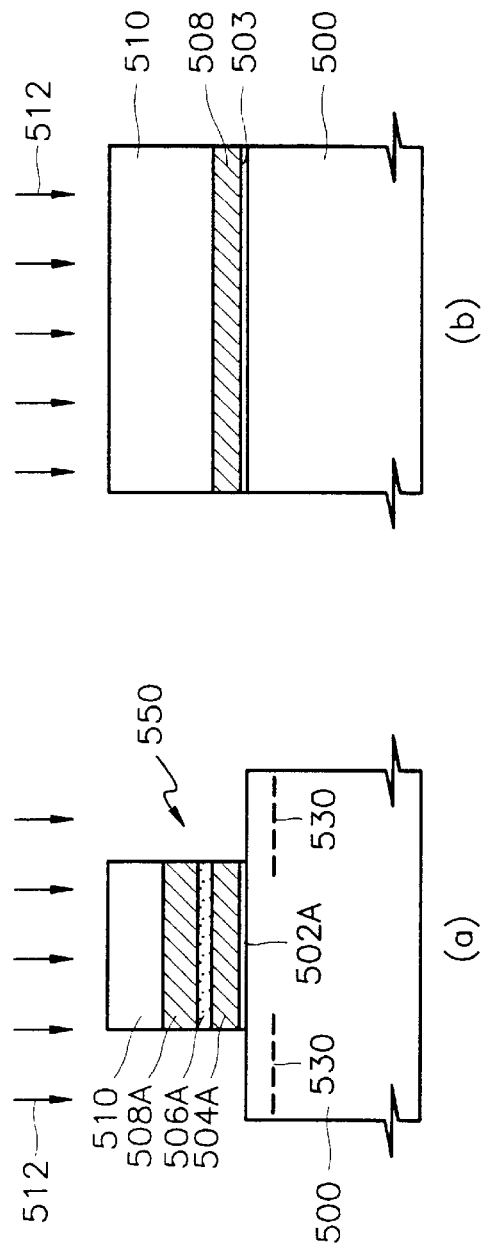

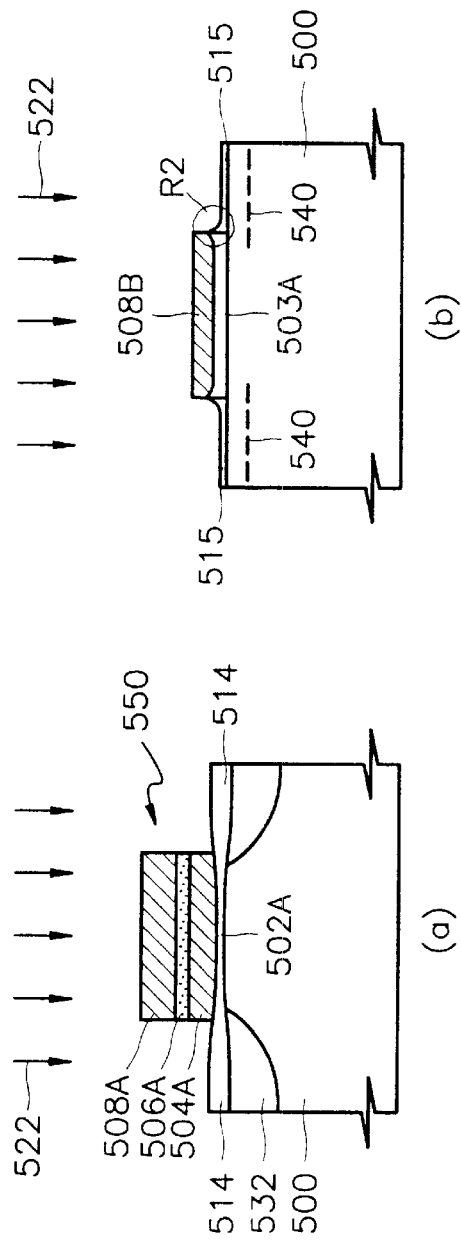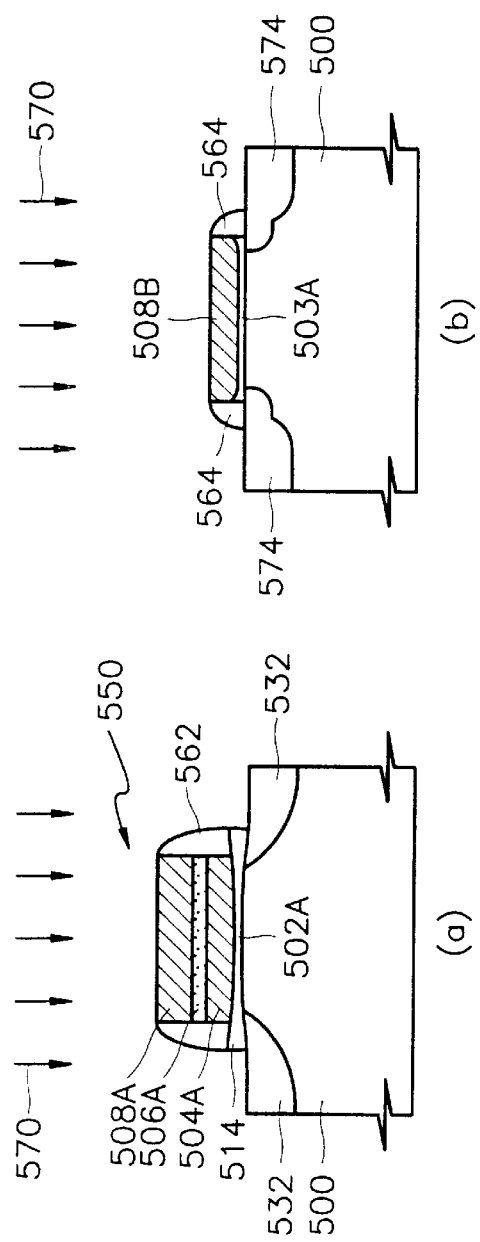

METHODS OF FABRICATING NONVOLATILE MEMORY DEVICES INCLUDING BIRD'S BEAK OXIDE

CROSS-REFERENCE TO RELATED APPLICATION

This application is a divisional of application Ser. No. 09/026,539, filed Feb. 19, 1998, entitled Nonvolatile Memory Devices Including Bird's Beak Oxide, assigned to the assignee of the present application, which itself claims the benefit of Korean Patent Application No. 1997-7258, filed Mar. 5, 1997, the disclosures of which are hereby incorporated herein by reference in their entirety as if set forth fully herein.

FIELD OF THE INVENTION

The present invention relates to integrated circuit fabrication, and more particularly to nonvolatile memory devices and methods for fabricating the same.

BACKGROUND OF THE INVENTION

Nonvolatile memory devices are widely used in electronic systems to retain information. One type of nonvolatile memory device is an erasable and programmable read only memory (EPROM). An EPROM is generally electrically programmed by forming channel hot electrons (CHE) in a drain and injecting the channel hot electrons into a floating gate. An erasing operation in the EPROM is generally performed optically by exposing a memory cell to ultraviolet rays and emitting electrons captured by the floating gate.

FIG. 1 is a sectional view of a conventional nonvolatile memory cell in which the programming operation is performed by injecting the CHE formed around the drain from the channel of the drain into the floating gate, as mentioned above.

Referring to FIG. 1, in a conventional nonvolatile memory cell, a gate oxide film 102 is formed on an integrated circuit substrate such as a semiconductor substrate 100 and a floating gate 104 is formed thereon. An interlayer dielectric film 106 such as an oxide/nitride/oxide (ONO) film is formed on the floating gate 104 and a control gate 108 is formed thereon. Specifically, the floating gate 104 is formed on a channel area between a source region 112 and a drain region 114. The floating gate 104 is electrically floated and the surroundings thereof are insulated by a silicon oxide film. Therefore, when charges are injected into the floating gate 104, the charges semi-permanently remain in the floating gate 104.

FIG. 2 is a circuit diagram partially showing an example of a NOR-type nonvolatile memory device obtained by arranging an array of memory cells shown in FIG. 1.

The operation of a general nonvolatile memory device is described as follows, referring to FIGS. 1 and 2. An operation for reading a selected cell in a circle marked with a reference numeral A is performed by sensing whether there are charges stored in the floating gate 104. When a voltage Vd, for example, a voltage of 1.0 V is applied to the drain region 114 and a voltage Vcg, for example, a voltage of 1.5 to 5.0 V is applied to the control gate 108, the existence or nonexistence of drain current flowing from the drain region 114 to the source region 112 is dependent on the quantity of the charges stored in the floating gate 104. The state of a cell, namely, the on or off state of a transistor, is determined from the existence or nonexistence of the drain current.

A power supply voltage Vcc generally is used as the voltage Vcg which is applied to the control gate 108. The threshold voltage Vth of the erased cell is preferably low, so that operations can be performed at a wide range of Vcc. Preferably, the threshold voltage of the erased cell is far lower than the power supply voltage applied to the control gate in order to correctly read the information of the erased cell.

CHE injection is used for programming the selected cell in the circle marked with the reference numeral A. When a drain voltage Vd=6 V is applied to a selected bit line (B/L-1), a control gate voltage Vcg=10 to 14 V is applied to a selected word line (W/L-1), and non-selected word lines (W/L-2, W/L-3, and W/L-4) are all grounded, some of the electrons flowing the channel are accelerated by a lateral electric field by the drain voltage Vd. When the accelerated electrons have sufficient energy for tunneling the gate oxide film 102 of the cell, they are injected into the floating gate 104 by a vertical electric field by the control gate voltage.

Table 1 shows the respective operational conditions of the above-mentioned nonvolatile memory cell array.

TABLE 1

| Operation | Program | Read |
|---|---|---|
| selected bit line | 6 V | 1 V |
| non-selected bit line | floating | floating or 0 V |
| selected word line | 12 V | Vcc |
| non-selected word line | 0 V | 0 V |
| common source | 0 V | 0 V |
| semiconductor substrate | 0 V | 0 V |

The quantity of the electrons captured by the floating gate during the programming operation is generally determined by the electric potential of the floating gate. When the electrons are captured by the floating gate, the threshold voltage Vth of the transistor controlled by the control gate becomes higher. The information "1" or "0" is determined by the change $\Delta$Vth of the threshold voltage.

FIG. 3 is a graph showing the $\Delta$Vth of the threshold voltage after programming and erasing in a nonvolatile memory cell operating as mentioned above.

In general, it is preferable that the threshold voltage is dramatically shifted by a low applied voltage and in a short writing time. Unfortunately however, nonvolatile memory devices may have problems during the programming operation. These problems will be described in detail as follows:

FIG. 4 is an equivalent circuit diagram of the nonvolatile memory cell shown in FIG. 1. When the programming operation is performed in the NOR-type nonvolatile memory device shown in FIG. 2, voltages of 6 V and 0 V are respectively applied to the drain and the control gate of the non-selected cell B that share a bit line with the selected cell A as shown in the Table 1.

Thus, in the non-selected cell B, the floating gate is capacitively coupled to the drain region and the electric potential of the floating gate is affected by the electric potential of the drain region. The floating gate voltage at this time can be expressed as follows:

First, the following Equation 1 can be derived from FIG. 4:

$$Vfg = \gamma cg \cdot Vcg + \gamma d \cdot Vd + \gamma s \cdot Vs + \gamma b \cdot Vb \tag{1}$$

wherein, Vfg is the floating gate voltage, Vcg is the control gate voltage, Vd is the drain voltage, Vs is the source voltage, and Vb is a bulk voltage. Also, $\gamma$cg, $\gamma$d, $\gamma$s and $\gamma$b respectively denote coupling ratios and can be represented as follows:

γcg=Cono/Ctotal
γd=Cd/Ctotal
γs=Cs/Ctotal
γb=Cb/Ctotal
wherein, Ctotal=Cono+Cd+Cb+Cs. Cono is the capacitance of the interlayer dielectric film, Cd is an overlap capacitance between the floating gate and the drain, Cs is an overlap capacitance between the floating gate and the source, and Cb is the capacitance of the gate oxide film.

During the programming operation, the floating gate voltage Vfg is represented by the following Equation 2 since the control gate voltage Vcg, the bulk voltage Vb, and the source voltage Vs of the non-selected cell are all 0 V:

$$Vfg=\gamma d \cdot Vd \quad (2)$$

In the cell which is not selected, a weak inversion layer may be formed in the channel area by the voltage induced by the floating gate of the cell due to capacitive coupling. The floating gate voltage may increase and may exceed the threshold voltage Vth in the cell, to thereby completely form the channel. Thus leakage currents through the channel may rapidly increase.

FIG. 5 is a graph showing leakage currents by the drain voltage in the non-selected cell of a conventional NOR-type nonvolatile memory device. The leakage currents generated as mentioned above can cause more serious problems as the threshold voltage Vth of the erased cell becomes lower. Thus, such leakage currents can cause more serious problems to memories which are usable with a wide range of operating voltages Vcc. The leakage currents generated by the drain voltage in the non-selected cell are generated in all the non-selected cells sharing one bit line. Therefore, the voltage applied to the bit line during the programming operation may decrease, thus reducing the programming speed of the selected cell.

In view of the above, it is desirable to prevent the formation of the inversion layer by minimizing the Vfg expressed in the above Equation 2 in order to suppress the leakage currents in the non-selected cell. The capacitive coupling problem and potential solutions to this problem are described in a publication entitled *"Characterization and Suppression of Drain Coupling in Submicrometer EPROM Cells"* by Prall et al., IEEE Transactions on Electron Devices, Vol. ED-34, No. 12, December 1987, pp. 2463–2468. Proposed solutions for minimizing the main coupling include use of sidewall spacers or oxidations, reduction of the junction depth, lightly doped drains, heavily doped junctions, asymmetrical EPROM cells, limits on the number of EPROM cells tied to a common bit line or floating the sources of unselected cells. Notwithstanding these solutions, there continues to be a need for integrated circuit nonvolatile memory devices and fabrication methods which can reduce drain capacitive coupling.

SUMMARY OF THE INVENTION

It is therefore an object of the present invention to provide improved integrated circuit nonvolatile memory devices and methods of fabricating same.

It is another object of the present invention to provide nonvolatile memory devices and fabrication methods which can reduce drain capacitive coupling effects.

These and other objects are provided, according to the present invention, by separating the edge portion of the floating gate of a nonvolatile memory cell from the integrated circuit substrate by more than the central portion. This increased separation is preferably provided by thickening the gate oxide film between the edge portion of the floating gate and the integrated circuit substrate, compared to the gate oxide film between the central portion of the floating gate and the integrated circuit.

The thick edge portion gate oxide is preferably provided by a bird's beak oxide area between the spaced apart source and drain regions and the floating gate that is thicker than the gate oxide film. Thus, the bird's beak phenomenon wherein thermal oxidation of silicon causes lateral encroachment and thickening of the resultant oxide, is used to improve the performance of integrated circuit nonvolatile memory devices. The bird's beak is often regarded as undesirable and many techniques are used to prevent bird's beaks in field oxide regions. However, according to the present invention, bird's beak in a nonvolatile memory cell gate oxide may be used to improve the performance of the nonvolatile memory device.

Integrated circuit nonvolatile memory devices according to the invention include an array of nonvolatile memory cells and peripheral circuits in an integrated circuit substrate. The nonvolatile memory cells comprise spaced apart source and drain regions in the integrated circuit substrate and a gate oxide film on the integrated circuit substrate between the spaced apart source and drain regions. A floating gate is included on the gate oxide film, opposite the substrate and an interlayer dielectric film is included on the floating gate, opposite the gate oxide film. A control gate is also included on the interlayer dielectric film, opposite the floating gate. A bird's beak oxide area is included between the spaced apart source and drain regions and the floating gate. The bird's beak oxide area is thicker than the gate oxide film.

Preferably, the floating gate and the source and drain regions define an overlapping area and the bird's beak oxide area is in the overlapping area. The bird's beak may be between 100 Å and 1000 Å thick. The peripheral circuits preferably include a plurality of peripheral circuit transistors. The peripheral circuit transistors include spaced apart peripheral source and drain regions in the integrated circuit substrate and a bird's beak-free peripheral circuit gate oxide film on the integrated circuit substrate between the spaced apart peripheral circuit source and drain regions. A peripheral circuit gate is included on the peripheral circuit gate oxide film, opposite the substrate. The spaced apart peripheral circuit source and drain regions preferably comprise lightly doped peripheral circuit source and drain regions.

Thus, the gate oxide film between the edge portion of the floating gate and the integrated circuit substrate is thicker than between the central portion of the floating gate and the integrated circuit substrate. Stated differently, the floating gate has a central portion, and an edge portion that is separated from the integrated circuit substrate by more than the central portion. Drain capacitive coupling may thereby be reduced and the performance of the integrated circuit memory devices may thereby be improved.

Integrated circuit nonvolatile memory devices may be fabricated, according to the present invention, by forming an array of nonvolatile memory cells in an integrated circuit substrate. The nonvolatile memory cells include a gate oxide film on the integrated circuit substrate, and a floating gate on the gate oxide film opposite the substrate. The floating gate has a central portion and an edge portion. The integrated circuit substrate is then thermally oxidized to produce a bird's beak in the gate oxide film adjacent the peripheral portion of the floating gate, to thereby separate the edge portion of the floating gate from the integrated circuit substrate by more than the central portion.

Prior to thermal oxidation, ions may be implanted into the integrated circuit substrate using the floating gate as a mask. The thermally oxidizing step then can simultaneously diffuse the implanted ions, to thereby form spaced apart source and drain regions in the integrated circuit substrate.

Peripheral circuit devices may also be formed in the integrated circuit substrate. The peripheral circuit devices include a gate oxide film on the integrated substrate, and a peripheral circuit gate on the gate oxide film opposite the integrated circuit substrate. During thermal oxidation, bird's beak formation in the gate oxide film adjacent the peripheral circuit gate is prevented. Bird's beak formation in the peripheral circuit gate may be prevented by masking the peripheral circuit devices to prevent implantation of the ions into the peripheral circuit devices.

After thermal oxidation, ions may be implanted into the integrated circuit substrate to form lightly doped drain regions in the integrated circuit substrate adjacent the peripheral circuit gates. The bird's beak regions block implantation of the ions into the integrated circuit substrate adjacent the floating gate.

More specifically, methods according to the present invention define an active region and a non-active region in a semiconductor substrate. An insulating film is formed on the active region of the semiconductor substrate. A first conductive layer and a second conductive layer are sequentially formed on the insulating film. A first photoresist pattern is formed on the second conductive layer. A gate pattern in which the gate oxide film, the floating gate, the interlayer dielectric film pattern and the control gate are sequentially stacked is formed on a predetermined portion of the active region by patterning the second conductive layer, the interlayer dielectric film, the first conductive layer, and the first insulating film using the first photoresist pattern as an etching mask, while exposing active areas on both sides of the gate pattern. Second conductivity type impurity ions for forming the source and drain regions are implanted into the exposed active region. The first photoresist pattern is removed. An LDD ion implantation preventing oxide film which is thicker than the gate oxide film is formed on the exposed active region. A spacer formed of an insulating film is formed on the side wall of the gate pattern.

The LDD ion implantation preventing oxide film is formed by performing a thermal oxidation with respect to the resultant structure in which the first photoresist pattern is removed.

According to another aspect, the active region and the non-active region are defined on the first conductivity type semiconductor substrate comprising the cell array region and the peripheral circuit region. The insulating film is formed on the active region. The first conductive layer and the interlayer dielectric film are sequentially formed on the insulating film of the cell array region. The second conductive layer is formed on the interlayer dielectric film of the cell array region and on the insulating film of the peripheral circuit region. The gate pattern in which the gate oxide film, the floating gate, the interlayer dielectric film pattern and the control gate are sequentially stacked is formed while exposing the active region on both sides of the gate pattern, by patterning the second conductive layer, the interlayer dielectric film, the first conductive layer and the insulating film in the cell array region. An ion implantation layer is formed by implanting second conductivity type impurity ions for forming the source and drain regions into the exposed active region of the cell array region. A peripheral circuit gate and a gate insulating film are formed by patterning the second conductive layer and the insulating film in the peripheral circuit region.

The LDD ion implantation preventing oxide film which is thicker than the insulating film is formed in the active region of the cell array region in the exposed active region. The LDD ion implantation layer is formed in the peripheral circuit region by implanting second conductivity type low density impurity ions into the resultant structure with exposing the LDD ion implantation preventing oxide film. The spacer is formed on the side walls of the gate pattern and the peripheral circuit gate. The source and drain regions of the LDD structure are formed in the peripheral circuit region by implanting second conductivity type high density impurity ions into the resultant structure.

The LDD ion implantation preventing oxide film is formed by performing the thermal oxidation with respect to the structure having the ion implantation layer. The second conductivity type low density impurity ions are implanted using energy that is sufficiently low such that the second conductivity type low density impurity ions do not pass through the LDD ion implantation preventing oxide film in a step of forming the LDD ion implantation layer.

According to the present invention, it is possible to reduce an overlap capacitance between the floating gate and the drain and to prevent the characteristic of a memory cell from deteriorating.

BRIEF DESCRIPTION OF THE DRAWINGS

FIGS. 7(a) and 7(b) through 13(a) and 13(b) are sectional views showing methods for manufacturing nonvolatile memory devices according to the preferred embodiment of the present invention.

DETAILED DESCRIPTION OF PREFERRED EMBODIMENTS

Figure 1:
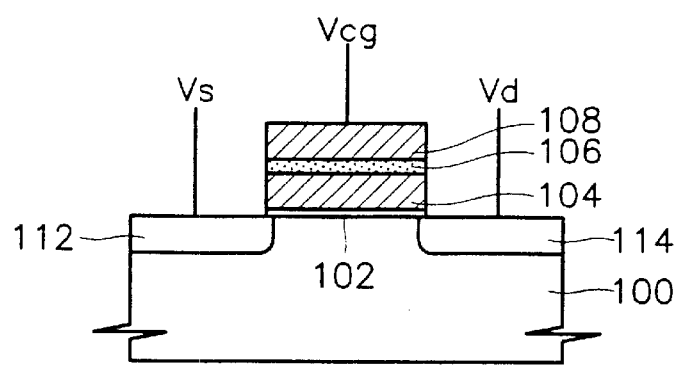
FIG. 1 is a sectional view of a conventional nonvolatile memory cell.
Figure 2:
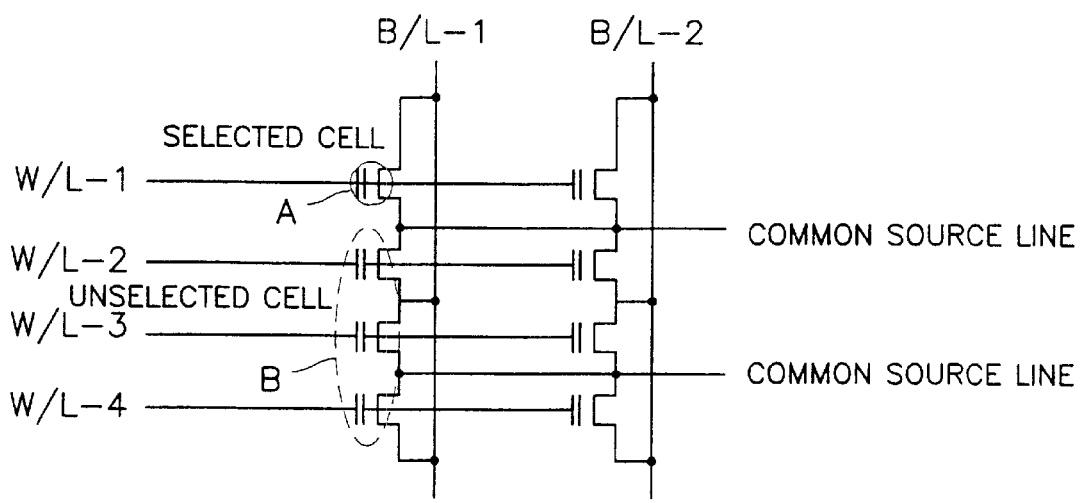
FIG. 2 is a circuit diagram partially showing an embodiment of a NOR-type nonvolatile memory device.
Figure 3:
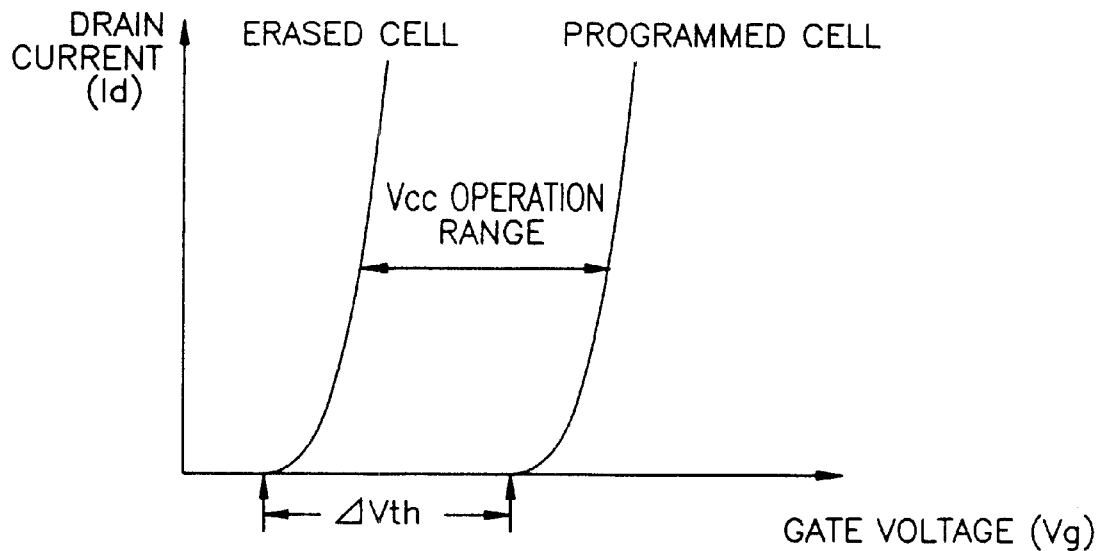
FIG. 3 is a graph showing the change of a threshold voltage after programming and erasing operation of the NOR-type nonvolatile memory cell.
Figure 4:
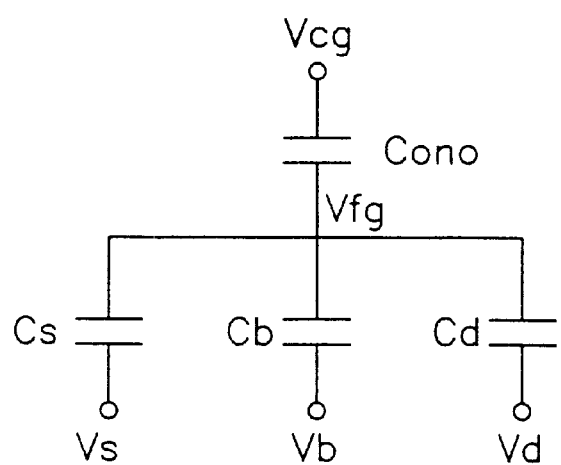
FIG. 4 is an equivalent circuit diagram of the nonvolatile memory cell of FIG. 1.
Figure 5:
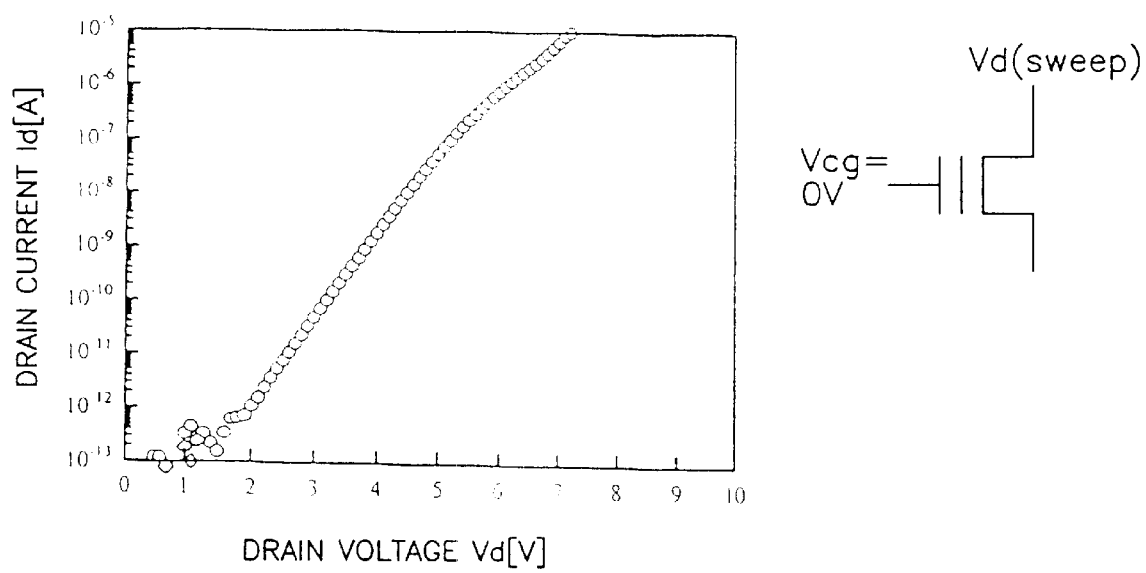
FIG. 5 is a graph showing leakage currents by a drain voltage in a non-selected cell of the NOR-type nonvolatile memory device.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 6:
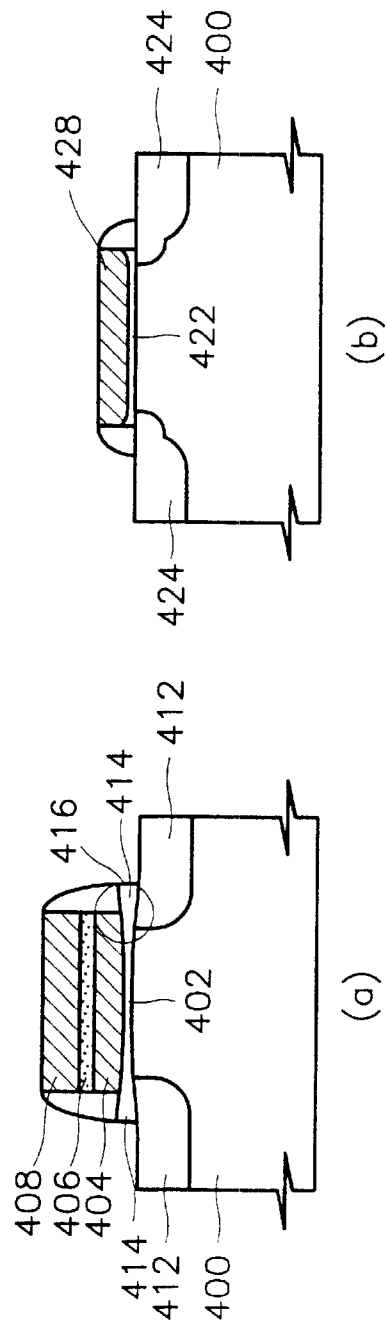
FIGS. 6(a) and 6(b) are sectional views showing main portions of the cell array region and the peripheral circuit region of nonvolatile memory devices according to a preferred embodiment of the present invention.
Figure 7:
Figure 10:
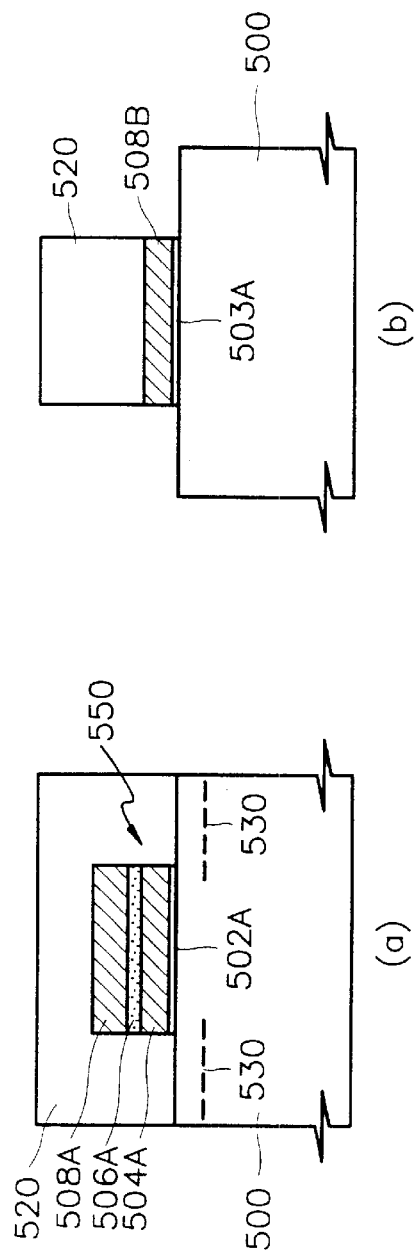

FIGS. 6(a) and 6(b) are sectional views of the cell array region and the peripheral circuit region of nonvolatile memory devices according to the present invention.

Referring to FIGS. 6(a) and 6(b), the cell array region of a nonvolatile memory device according to the present invention includes a first conductivity type, for example, P-type semiconductor substrate 400, second conductivity type, for example, N-type source and drain regions 412 spaced apart from each other with a channel region therebetween on the surface of the semiconductor substrate 400. A gate oxide film 402 is on the surface of the semiconductor substrate 400 between the spaced apart source and drain regions 412. A floating gate 404 is on the gate oxide film 402 and a control gate 408 is separated from the floating gate on the upper portion of the floating gate 404. A bird's beak area 414 is between the source/drain regions 412 and the floating gate 404 and is thicker than the gate oxide film 402, preferably having a thickness of about 100 Å to 1,000 Å. Stated differently, the gate oxide film between the edge portion of the floating gate 404 and the substrate 400 is thicker than between the central portion of the floating gate and the substrate. An interlayer dielectric film 406 is included between the floating gate 404 and the control gate 408. The interlayer dielectric film 406 is preferably formed of an oxide/nitride/oxide (ONO) film. Also, the edge or fringe of the floating gate 404 is overlapped with the source and drain regions 412 and the bird's beak area 414 is formed in the overlapped area.

The peripheral circuit region of a nonvolatile memory device according to the present invention includes a first conductivity type, for example, P-type semiconductor substrate 400, source and drain regions of a lightly doped drain (LDD) structure separated from each other with the channel area therebetween on the surface of the semiconductor substrate 400, and a transistor having a peripheral circuit gate 428 formed in the upper portion of the channel region with the gate oxide film 422.

In nonvolatile memory devices according to the present invention constructed as mentioned above, since a bird's beak area thicker than the gate oxide film is formed in the area in which the source/drain regions and the floating gate are overlapped in the cell array region, it is possible to reduce the overlap capacitance Cd of the drain region which directly affects γd.

FIGS. 7(a) and 7(b) through 13(a) and 13(b) are sectional views showing methods for fabricating nonvolatile memory devices according to the present invention. In the respective drawings, (a) is a sectional view of the cell array region and (b) is a sectional view of the peripheral circuit region.

Referring to FIGS. 7(a) and 7(b), an insulating film 502, for example an oxide film obtained by a thermal oxidation processing, is formed to have a thickness of about 90 Å after defining the active region and the non-active or inactive region on a first conductivity type substrate 500, for example, a P-type silicon substrate.

Referring to FIGS. 8(a) and 8(b), a first conductive layer such as a polysilicon layer and an interlayer dielectric film such as an ONO film are formed on the structure having the insulating film 502. A first conductive layer pattern 504 and an interlayer dielectric film pattern 506 are formed in the cell array region by patterning the first conductive layer and the interlayer dielectric film. Then, a thin insulating film 503 is formed in the peripheral circuit region and a second conductive layer 508 such as a polysilicon layer is formed all over the upper surface of the cell array region and the peripheral circuit region.

Referring to FIGS. 9(a) and 9(b), a photoresist layer is formed in the cell array region and the peripheral circuit region of the resultant structure and a first photoresist pattern 510 for forming the control gate is formed by patterning the photoresist layer in the cell array region. Then, a control gate 508A, an interlayer dielectric film pattern 506A, a floating gate 504A and a gate oxide film 502A are formed by etching the second conductive layer 508, the interlayer dielectric film pattern 506, the first conductive layer pattern 504 and the oxide film 502 in a self-aligned manner using the first photoresist pattern 510 as an etching mask in the cell array region, to thereby form a gate pattern 550.

Then, an ion implantation layer 530 is formed in the cell array region of the semiconductor substrate 500 by implanting second conductivity type, namely, N-type impurity ions 512 such as an arsenic (As) ion into the structure using the first photoresist pattern 510 as an ion implantation mask in order to form the source and drain regions in the cell array region. At this time, since the first photoresist pattern 510 and the second conductive layer 508 remain in the peripheral circuit region, the N-type impurities 512 are not implanted into the peripheral circuit region of the semiconductor substrate 500.

The ion implantation for forming the ion implantation layer 530 is performed in a state in which the first photoresist pattern 510 is not removed in the present embodiment. However, it is possible to perform a blanket implantation without using an additional ion implantation mask after removing the first photoresist pattern 510. Since the second conductive layer 508 serves as the ion implantation mask in the peripheral circuit region, the N-type impurities 512 are not implanted in the peripheral circuit region of the semiconductor substrate 500.

Referring to FIGS. 10(a) and 10(b), the first photoresist pattern 510 is removed, a photoresist layer is formed in the cell array region and the peripheral circuit region of the structure, and a second photoresist pattern 520 for forming the peripheral circuit gate is formed in the peripheral circuit region by patterning the photoresist layer. At this time, the cell array region is covered with the second photoresist pattern 520. Then, a peripheral circuit gate 508B and a gate oxide film 503A are formed in the peripheral circuit region by etching the second conductive layer 508 and the oxide film 503 using the second photoresist pattern 520 as an etching mask.

Figure 11:
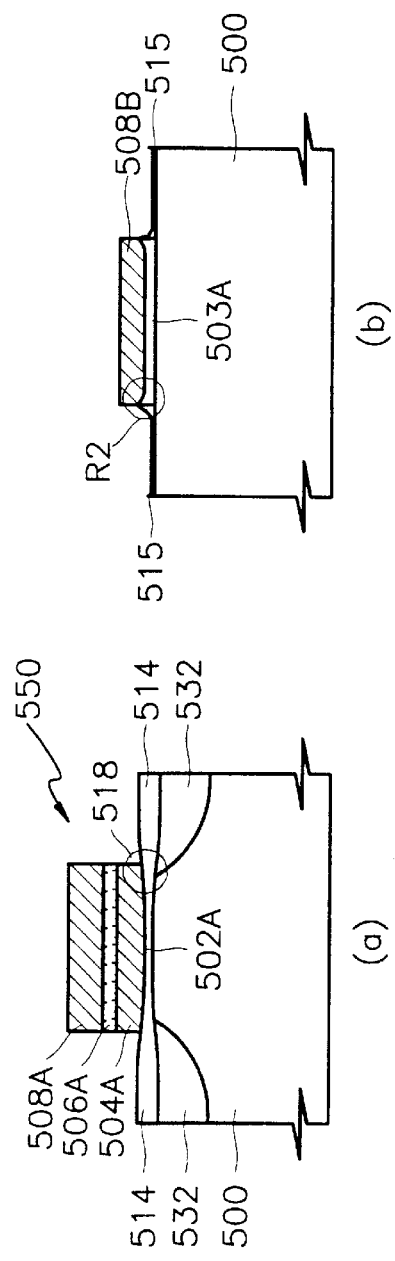

Referring to FIGS. 11 (a) and 11 (b), source and drain regions 532 to which the impurities of the ion implantation layer 530 are diffused are formed and an LDD ion implantation preventing oxide film 514 thicker than the gate oxide film 502A is formed to have a predetermined thickness in the surface of the source and drain regions 532 by removing the second photoresist pattern 520 and performing the thermal oxidation with respect to the resultant structure. At this time, a thin oxide film 515 is formed on the surface of the semiconductor substrate 500 by the thermal oxidation processing in the peripheral circuit region. However, the oxide film 515 is formed to be much thinner than the LDD ion implantation preventing oxide film 514 since the impurity ions are implanted from the source and drain regions 532 to the surface of the cell array region in the semiconductor substrate 500.

The LDD ion implantation preventing oxide film 514 is preferably formed to be thicker than the oxide film 515 by 200 Å. As a result, the surroundings of the gate pattern 550 are oxidized. Thus, a bird's beak area 518 thicker than the gate oxide film 502A is formed in the area in which the floating gate 504A is overlapped with the source and drain regions 532. The overlap capacitance Cd of the drain region can be reduced by increasing the thickness of the insulating film intervening the floating gate 504A and the source/drain regions 532 in the bird's beak area 518 formed as above.

Meanwhile, the lower portion of the edge of the peripheral circuit gate 508B of the peripheral circuit region is thermally oxidized and rounded as shown in the circle marked with the "R2" through the above-mentioned thermal processing.

Referring to FIGS. 12(a) and 12(b), an LDD ion implantation layer 540 is formed in the semiconductor substrate 500 of the peripheral circuit region by blanket implanting first conductivity type impurity ions 522 such as a phosphorus (P) ion without a special ion implantation mask covering the cell array region. At this time, the implantation energy of the impurity ions 522 is controlled to the extent that the impurity ions 522 pass through the oxide film 515 of the peripheral circuit region and do not pass the LDD ion implantation preventing oxide film 514.

Referring to FIGS. 13(a) and 13(b), an insulating layer such as an oxide layer is formed by a chemical vapor deposition (CVD) on the entire surface of the semiconductor substrate having the LDD ion implantation layer 540. Spacers 562 and 564 are respectively formed on the side walls of the gate pattern 550 and the peripheral circuit gate 508B by anisotropic etching the insulating layer.

Then, second conductivity type impurity ions 570 such as the arsenic (As) ions are implanted using the spacers 562 and 564, the gate pattern 550 and the peripheral circuit gate 508A as ion implantation masks. The transistors of the cell array region and the peripheral circuit region are completed by forming source and drain regions 574 of the LDD structure on the surface of the semiconductor substrate 500 on both sides of the peripheral circuit gate 508B through the following thermal processing. General CMOS fabrication processing steps may then be performed to complete the devices.

As mentioned above, since the bird's beak area formed of an oxide film thicker than the gate oxide film is formed in the portion in which the source and drain regions are overlapped with the floating gate in the cell array region in nonvolatile memory devices according to a preferred embodiment of the present invention, it is possible to reduce the overlap capacitance Cd of the drain region which directly affects γd.

Also, when a peripheral circuit transistor is fabricated, it is not necessary to form an additional photoresist pattern for preventing the impurities for forming the LDD ion implantation layer from being ion-implanted like in a conventional technology, since the implantation of the impurities into the cell array region can be prevented by the LDD ion implantation preventing oxide film during an ion implantation processing for forming the LDD ion implantation layer. As a result, it is possible to simplify processing and to improve the program characteristics of a cell.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating an integrated circuit nonvolatile memory device comprising the steps of:
   forming an array of nonvolatile memory cells in a first portion of an integrated circuit substrate, the nonvolatile memory cells including a gate oxide film on the integrated circuit substrate and a floating gate on the gate oxide film, opposite the substrate, the floating gate having a central portion and an edge portion;
   forming a plurality of peripheral circuit devices in a second portion of the integrated circuit substrate, the peripheral circuit devices including a gate oxide film on the integrated circuit substrate and a peripheral circuit gate on the gate oxide film opposite the integrated circuit substrate;
   forming a peripheral circuit mask over the peripheral circuit devices;
   implanting ions into the first portion of the integrated circuit substrate, using the floating gate as a mask to prevent ion implantation thereunder, to form source and drain regions adjacent to the edge portion of the floating gate, and using the peripheral circuit mask to prevent ion implantation thereunder in the second portion of the integrated circuit substrate; and
   thermally oxidizing the integrated circuit substrate, the implanted ions in the source and drain regions producing a bird's beak in the gate oxide film adjacent the edge portion of the floating gate, to thereby separate the edge portion of the floating gate from the integrated circuit substrate by more than the central portion, while the prevention of ion implantation in the second portion of the integrated circuit substrate producing an oxide film, in the integrated circuit substrate that is adjacent to the peripheral circuit gate, that has a thickness that is less than the gate oxide film between the peripheral circuit gate and the integrated circuit substrate.

2. A method according to claim 1,
   wherein the thermally oxidizing step simultaneously diffuses the implanted ions to thereby form spaced apart source and drain regions in the integrated circuit substrate.

3. A method according to claim 1
   wherein the thermally oxidizing step is followed by the step of implanting ions into the integrated circuit substrate to form lightly doped source and drain regions in the integrated circuit substrate adjacent the peripheral circuit gates, the birds beak region blocking implantation of the ions into the integrated circuit substrate adjacent to the floating gate.

4. A method for fabricating a nonvolatile memory device, comprising the steps of:
   defining an active region and an inactive region on a first conductivity type semiconductor substrate comprising a cell array region and a peripheral circuit region;
   forming an insulating film on the active region of the semiconductor substrate;
   sequentially forming a first conductive layer and an interlayer dielectric film on the insulating film of the cell array region;
   forming a second conductive layer on the interlayer dielectric film of the cell array region and the insulating film of the peripheral circuit region;
   forming a first photoresist pattern on the second conductive layer;
   forming a gate pattern in which a gate oxide film, a floating gate, an interlayer dielectric film pattern and a control gate are sequentially stacked on a predetermined portion of the active region by patterning the second conductive layer, the interlayer dielectric film, the first conductive layer, and the insulating film in the cell array region using the first photoresist pattern as an etching mask and exposing the active region on both sides of the gate pattern;

implanting second conductivity type impurity ions for forming the source and drain regions into the exposed active region of the cell array region while using at least one of the first photoresist pattern and the second conductive layer as an ion implantation mask over the peripheral circuit region;

removing the first photoresist pattern; and thermally oxidizing the exposed active regions of the cell array region, using the implanted second conductivity type impurity ions to provide a first oxidation rate and form an LDD ion implantation preventing oxide film that is thicker than the gate oxide film, while thermally oxidizing the peripheral circuit region at a second oxidation rate that is less than the first oxidation rate.

5. A method according to claim 4, further comprising the step of implanting impurity ions using the LDD ion implantation preventing oxide film as a mask.

6. A method according to claim 4, wherein the first conductive layer and the second conductive layer comprise polysilicon.

7. A method according to claim 4, wherein the interlayer dielectric film comprises an oxide/nitride/oxide (ONO) film.

8. A method according to claim 4, wherein the LDD ion implantation preventing oxide film is formed by performing a thermal oxidization after the first photoresist pattern is removed.

9. A method According to claim 8, wherein the LDD ion implantation preventing oxide film has a thickness of 100 to 1,000 Å.

10. A method for fabricating a nonvolatile memory device, comprising the steps of:

defining an active region and an inactive region on a first conductivity type semiconductor substrate comprising a cell array region and a peripheral circuit region;

forming an insulating film on the cell array region and the peripheral circuit region of the active region;

sequentially forming a first conductive layer and an interlayer dielectric film on the insulating film of the cell array region;

forming a second conductive layer on the interlayer dielectric film of the cell array region and the insulating film of the peripheral circuit region;

forming a gate pattern in which a gate oxide film, a floating gate, an interlayer dielectric film pattern and a control gate are sequentially stacked on a predetermined portion of the active region by patterning the second conductive layer, the interlayer dielectric film, the first conductive layer and the insulating film in the cell array region and exposing the active region on both sides of the gate pattern;

forming an ion implantation layer by implanting second conductivity type impurity ions for forming source and drain regions in the exposed active region of the cell array region;

forming a peripheral circuit gate and a peripheral circuit gate insulating film by patterning the second conductive layer and the insulating film in the peripheral circuit region;

forming an LDD ion implantation preventing oxide film, in the active region of the cell array region of the exposed active region, using the ion implantation layer to form the LDD ion implantation preventing oxide film thicker than the gate oxide film, while forming an oxide film adjacent to the peripheral circuit gate that is thinner than the peripheral circuit gate insulating film;

forming an LDD ion implantation layer in the peripheral circuit region by implanting second conductivity type low density impurity ions into the resultant structure using the LDD ion implantation preventing oxide film as a mask;

forming a spacer on the side walls of the gate pattern and the peripheral circuit gate; and forming source and drain regions of an LDD structure in the peripheral circuit region by implanting second conductivity type high density impurity ions.

11. A method according to claim 10, wherein the insulating film comprises a thermal oxide film.

12. A method according to claim 10, wherein the first conductive layer comprises a polysilicon layer.

13. A method according to claim 10, wherein the interlayer dielectric film comprises an ONO film.

14. A method according to claim 10, wherein the second conductive layer comprises a polysilicon layer.

15. A method according to claim 10, wherein the step of forming the gate pattern comprises the steps of:

forming a photoresist pattern that covers the peripheral circuit region and a portion of the cell array region after forming the second conductive layer; and forming a gate pattern by etching the second conductive layer, the interlayer dielectric film, the first conductive layer, and the insulating film in a self-aligned manner.

16. A method according to claim 15, wherein the step of implanting the second conductivity type impurity ions for forming the source and drain regions of the cell array region is performed without removing a photoresist pattern that is used for forming the gate pattern.

17. A method according to claim 15, wherein the step of implanting the second conductivity type impurity ions for forming the source and drain regions of the cell array region is performed after removing a photoresist pattern that is used for forming the gate pattern.

18. A method according to claim 10, wherein the LDD ion implantation preventing oxide film is formed by performing a thermal oxidization after forming the ion implantation layer.

19. A method according to claim 10, wherein the LDD ion implantation preventing oxide film has a thickness of 100 to 1,000 Å.

20. A method according to claim 10, wherein the second conductivity type low density impurity ions are implanted with such energy as not to pass the LDD ion implantation preventing oxide film, during the step of forming the LDD ion implantation layer.

* * * * *